US010362378B2

(12) United States Patent
Doi

(10) Patent No.: US 10,362,378 B2
(45) Date of Patent: Jul. 23, 2019

(54) MICROPHONE

(71) Applicant: Panasonic Intellectual Property Management Co., Ltd., Osaka (JP)

(72) Inventor: Kazumoto Doi, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/955,743

(22) Filed: Apr. 18, 2018

(65) Prior Publication Data
US 2018/0242065 A1 Aug. 23, 2018

Related U.S. Application Data

(63) Continuation of application No. PCT/JP2017/003281, filed on Jan. 31, 2017.

(30) Foreign Application Priority Data

Mar. 29, 2016 (JP) ................. 2016-006073

(51) Int. Cl.
H04R 1/04 (2006.01)
B60R 11/02 (2006.01)
(Continued)

(52) U.S. Cl.
CPC ............ H04R 1/04 (2013.01); B60R 11/0247 (2013.01); H04R 19/04 (2013.01); H05K 1/181 (2013.01);
(Continued)

(58) Field of Classification Search
CPC .......... H04R 2201/028; H04R 2201/34; H04R 2400/13; H04R 3/00; H04R 3/12;
(Continued)

(56) References Cited

U.S. PATENT DOCUMENTS

2015/0003638 A1* 1/2015 Kasai .................. H04R 1/08
381/122

FOREIGN PATENT DOCUMENTS

CN 103546854 A 1/2014
JP 6-057746 U 8/1994
(Continued)

OTHER PUBLICATIONS

International Search Report of PCT application No. PCT/JP2017/003281 dated Apr. 11, 2017.
(Continued)

Primary Examiner — Curtis A Kuntz
Assistant Examiner — Julie X Dang
(74) Attorney, Agent, or Firm — Greenblum & Bernstein, P.L.C.

(57) ABSTRACT

A microphone has: a printed circuit board provided with a first sound hole; a microphone element mounted on a first surface of the printed circuit board so as to cover the first sound hole; a microphone casing provided with a second sound hole opposite to the first sound hole, and housing the printed circuit board so that the second sound hole; and a bush provided with a third sound hole, and having a first contact surface and a second contact surface. The third sound hole is disposed between the first and second sound holes to be communicated with the holes. The first contact surface is in contact with a second surface of the printed circuit board at a first end of the third sound hole. The second contact surface is in contact with an inner surface of the microphone casing at a second end of the third sound hole.

4 Claims, 5 Drawing Sheets

(51) Int. Cl.
  *H04R 19/04* (2006.01)
  *H05K 1/18* (2006.01)
  *B81B 7/00* (2006.01)
  *H04R 1/08* (2006.01)
  *H04R 1/28* (2006.01)

(52) U.S. Cl.
  CPC ..... *B81B 7/0064* (2013.01); *B81B 2201/0257* (2013.01); *H04R 1/08* (2013.01); *H04R 1/2807* (2013.01); *H04R 2499/13* (2013.01); *H05K 2201/09072* (2013.01); *H05K 2201/10083* (2013.01)

(58) Field of Classification Search
  CPC . H04R 5/02; H04R 7/12; H04R 7/127; H04R 7/18; H04R 9/022; H04R 1/1075; H04R 19/04; H04R 1/1016; H04R 1/1033; H04R 1/1041; H04R 1/105; H04R 1/1066; H04R 1/2876; H04R 2201/107; B81B 7/0064; B81B 2201/0257
  USPC .......................... 381/74, 361, 174, 313, 355
  See application file for complete search history.

(56) References Cited

FOREIGN PATENT DOCUMENTS

| | | |
|---|---|---|
| JP | 2013-183164 | 9/2013 |
| JP | 2014-204179 | 10/2014 |
| WO | 2013/179834 | 12/2013 |

OTHER PUBLICATIONS

English Translation of Chinese Search Report dated Mar. 21, 2019 for the related Chinese Patent Application No. 201780004565.9.
English Translation of the First Office Action dated Mar. 21, 2019 for the related Chinese Patent Application No. 201780004565.9.
Partial English Translation of CN 103546854.

* cited by examiner

MICROPHONE

CROSS-REFERENCE TO RELATED APPLICATIONS

This application is a continuation of the PCT International Application No. PCT/JP2017/003281 filed on Jan. 31, 2017, which claims the benefit of foreign priority of Japanese patent application No. 2016-066073 filed on Mar. 29, 2016, the contents all of which are incorporated herein by reference.

BACKGROUND

1. Technical Field

The present disclosure relates to a microphone.

2. Description of the Related Art

Recently, such higher performance microphone modules have been developed that can reduce noises even in a noisy environment by designing a structure in which noises hardly enter or by a signal processing such as directivity synthesis or noise suppression using plural microphone elements. These high-performance microphone modules have been widely spreading for hands-free calling or voice recognition in automobiles. One example of such microphone modules is disclosed in International Publication No. 2013/179834.

Meanwhile, there is a tendency, particularly in automobiles, that many components other than the microphone module are mounted and the space for mounting the microphone module is reduced. Accordingly, development of a smaller and thinner microphone module has been required.

On the other hand, in designing a structure of a microphone module, sealing between structural components is required so that sound waves do not enter the microphone element from plural paths. In this regard, Unexamined Japanese Utility Model Publication No. H06-057746 discloses a structure for sealing between structural components.

In the automotive speaker disclosed in Unexamined Japanese Utility Model Publication No. H06-057746, a box opening is formed on the speaker box, and a speaker unit is housed inside of the box opening. Furthermore, an annular bulkhead is protruded outward from the periphery of the box opening. Moreover, an interior-member opening is formed on the interior member of the automobile. The periphery of the interior-member opening is joined to the annular bulkhead of the speaker box through a ring-shape seal member. The interior-member opening is covered with a grill to constitute an automotive speaker.

SUMMARY

A microphone of the present disclosure has a printed circuit board, a microphone element, a microphone casing, and a bush. The printed circuit board has a first surface and a second surface in a rare side of the printed circuit board from the first surface. The printed circuit board is provided with a first sound hole through the first surface and the second surface. The microphone element is mounted on the first surface of the printed circuit board so as to cover the first sound hole. The microphone casing is provided with a second sound hole and houses the printed circuit board such that the second sound hole opposes the first sound hole. The bush is provided with a third sound hole disposed between the second sound hole and the first sound hole so as to be communicated with the first sound hole and the second sound hole. The bush has a first contact surface, and a second contact surface. The first contact surface is in contact with the second surface of the printed circuit board at a first end of the third sound hole. The second contact surface is in contact with an inner surface of the microphone casing at a second end of the third sound hole. The microphone element is disposed so as to pick up an external sound wave through the second sound hole, the third sound hole and the first sound hole.

According to the present disclosure, it is possible to provide a small-size and high-performance microphone. Also, it is possible to achieve sealing around the sound hole to improve microphone performances, as well as taking such an advantage of the bottom port mount microphone sensor that allows the entire structure of the microphone module to be smaller or thinner.

DETAILED DESCRIPTION OF PREFERRED EMBODIMENTS

Figure 1A:
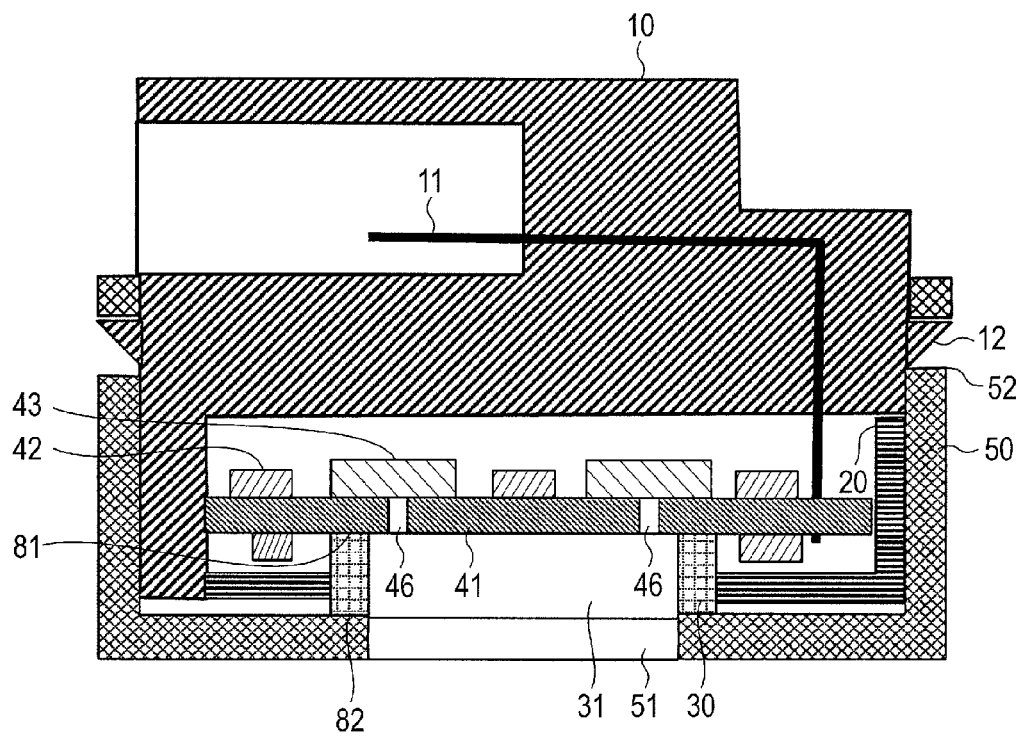
FIG. 1A is a diagram illustrating an inner structure of an automotive microphone according to a first exemplary embodiment.

Prior to describing exemplary embodiments of the present disclosure, problems of the conventional art will be briefly described. In a case of applying the automotive speaker disclosed in Unexamined Japanese Utility Model Publication No. H06-057746 to an automotive microphone, an annular bulkhead surrounding the microphone element is formed on the outer surface of the microphone casing in which the microphone element has been housed. The automotive microphone can be constituted by mounting the microphone casing in such a state that the annular bulkhead is pressed onto a grill through a ring-shape seal material.

Here, in the case of applying the automotive speaker disclosed in Unexamined Japanese Utility Model Publication No. H06-057746 to an automotive microphone, the microphone element and the grill are apart from each other through the annular bulkhead. As a result, a relatively large space is formed in the area surrounded by the microphone element, the annular bulkhead and the grill. Accordingly, a sound having entered from the grill into the space would likely resonate within the space to cause a noise. In other words, this structure is not sufficient as a sealing structure between components of an automotive microphone.

On the other hand, to respond to the size-reduction and thickness-reduction requirements, small and thin mount type microphone sensors which are surface-mountable using the MEMS (Micro Electro Mechanical Systems) fabrication method have been widely used. Particularly, a low-profile structure of an entire microphone module can be realized by a bottom port mount microphone sensor which is configured such that a sound hole is formed on a printed circuit board and a mount type microphone sensor is mounted to cover the sound hole so that the surface mount type microphone sensor can pick up sound from its backside through the sound hole.

As described above, it is necessary for improving the microphone performances to prevent sound leakage around the sound hole of the microphone sensor in order to prevent entry of noises themselves caused by entry of sounds through plural paths and performance degradation of the signal processing using plural microphone sensor signals. Therefore, even in a case of applying the bottom port mount microphone sensor, it is essential to have a structure designed for sealing.

However, the conventional microphone disclosed in PTL 1 or PTL 2 has a structure in which the surrounding area of the microphone element is covered with a rubber component for sealing, rather than having a structure in which a microphone sensor mounted on a printed circuit board picks up sound through a sound hole from the back side of the printed circuit board. Therefore, this structure of the conventional microphone is not suitable to the case of sealing the surrounding area of the sound hole on the printed circuit board used for the bottom port mount microphone sensor.

The present disclosure provides a microphone that can be suitably used, in particular, for an automotive microphone, and has a sealing structure for a bottom port mount microphone sensor mounted on a printed circuit board.

Exemplary embodiments of the present disclosure will hereinafter be described with reference to the drawings.

First Exemplary Embodiment

Figure 1B:
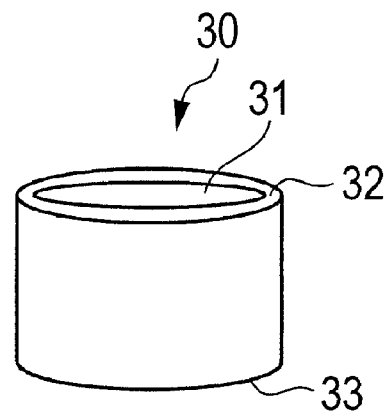
FIG. 1B is a perspective view illustrating a bush of the automotive microphone according to the first exemplary embodiment.
Figure 5:
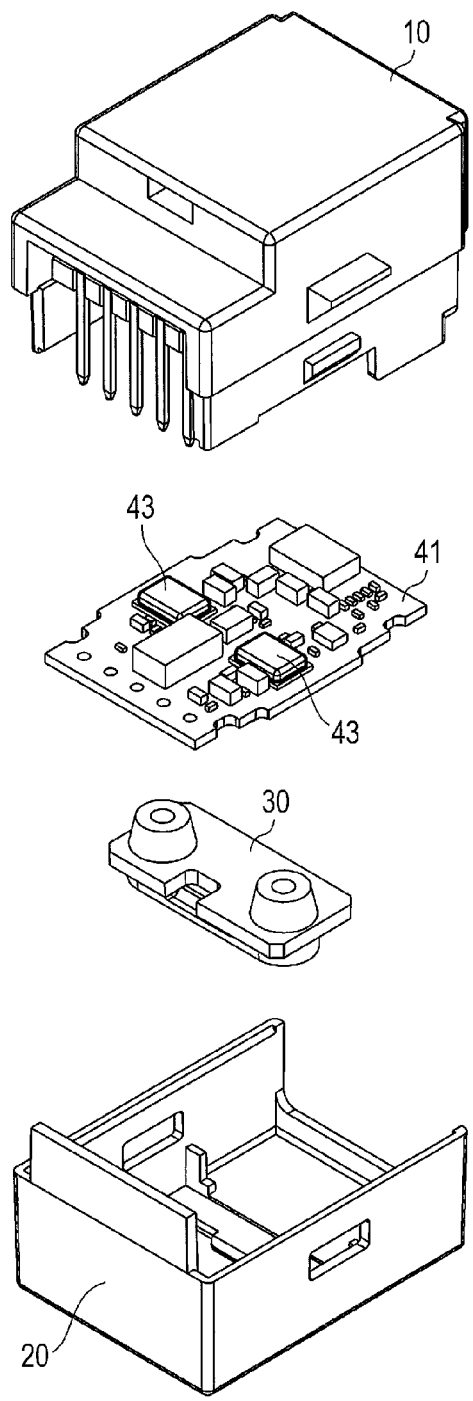
FIG. 5 is an exploded perspective view illustrating schematic structures of components of the automotive microphone according to the present exemplary embodiments.

FIG. 1A is a diagram illustrating an inner structure of an automotive microphone according to a first exemplary embodiment. FIG. 1B is a perspective view illustrating a structure of bush 30 of the automotive microphone according to the first exemplary embodiment. FIG. 5 is an exploded perspective view illustrating schematic structures of components of the automotive microphone according to the present exemplary embodiment. Although the bush shown in FIG. 5 has a structure according to a fourth exemplary embodiment, FIG. 5 is referred to here for explanatory convenience. Hereinafter, positional relations of respective parts will be described assuming the direction from which bottom port mount microphone sensor 43 picks up sound as downward.

An automotive microphone according to the present exemplary embodiment has bottom port mount microphone sensor 43 (a microphone element), printed circuit board 41, connector 10, bush 30, panel 20, and bezel 50.

The automotive microphone has a structure in which printed circuit board 41 is housed within an enclosing space formed by panel 20, bezel 50 (not shown in FIG. 5) and connector 10. In other words, a microphone casing is configured by panel 20, bezel 50 and connector 10.

In more detail, printed circuit board sound hole 46 for picking up sound (a first sound hole) is formed on printed circuit board 41, and bottom port mount microphone sensor 43 is disposed on an upper surface (a first surface) of printed circuit board 41 so as to cover printed circuit board sound hole 46. Bottom port mount microphone sensor 43 may, for example, be a surface mount type silicon microphone formed by the MEMS fabrication method.

Also, mount components 42 for forming an electric circuit are disposed on printed circuit board 41, and connector pins 11 of connector 10 is connected to any of mount components 42. An electric signal produced by bottom port mount microphone sensor 43 is output to the outside through mount components 42 and connector pins 11.

Bush 30 is disposed right below printed circuit board 41 as a sealing member. Bush 30 is disposed between printed circuit board sound hole 46 and bezel sound hole 51.

Bush 30 has bush sound hole 31 (a third sound hole) extending in a vertical direction, first contact surface 32 in contact with a lower surface (a second surface) of printed circuit board 41, and second contact surface 33 in contact with a lower-side inner surface of bezel 50.

Bush sound hole 31 is communicated with printed circuit board sound hole 46 and bezel sound hole 51. A sound wave having entered bezel sound hole 51 can propagate to bottom port mount microphone sensor 43 through bush sound hole 31 and printed circuit board sound hole 46.

First contact surface 32 of bush 30 is a part that is in contact with the lower surface of printed circuit board 41 at an upper end of bush sound hole 31. First contact surface 32 is in contact with the lower surface of printed circuit board 41 so as to surround a circumference of bush sound hole 31.

Second contact surface 33 of bush 30 is a part that is in contact with the lower-side inner surface of bezel 50 at a lower end of bush sound hole 31. Second contact surface 33 is in contact with the lower-side inner surface of bezel 50 so as to surround a circumference of bush sound hole 31.

Bush 30 is made of an elastic material, and is in close contact with the lower surface of printed circuit board 41 and the lower-side inner surface of bezel 50 at first contact surface 32 and second contact surface 33, respectively. With this structure, bush 50 prevents a sound wave having entered through bezel sound hole 51 from leaking through bush sound hole 31 and a sound wave having entered through the other areas than bezel sound hole 51 from propagating around to enter bush sound hole 31 and printed circuit board sound hole 46.

Connector 10 is disposed above printed circuit board 41 so as to cover printed circuit board 41. Connector 10 has connector pins 11 electrically connected to mount components 42 on printed circuit board 41. Connector pins 11 extend from the position of mount components 41 on printed circuit board 41 to the outside of bezel 50. Also, connector 10 has on its outer side surfaces two connector claws 12 for mounting bezel 50 thereto.

Panel 20, which is one of casing parts, is disposed around printed circuit board 41. Panel 20 is provided with a through hole into which bush 30 is fitted. Bush 30 is positioned with panel 30 by being fitted to the through hole of panel 20.

Bezel 50, which is an exterior part, is disposed around panel 20. Performances of the microphone module can be achieved even in a structure without bezel 50. However, in a case, for example, of a microphone module that is required to meet a plurality of designs, such as an automotive microphone module or the like, it is general to provide bezel 50 separately from panel 20, as an exterior part.

Bezel 50 is provided with bezel sound hole 51 (a second sound hole), and bezel slits 52. Bezel sound hole 51 receives an external sound wave to allow the sound wave to propagate to bush sound hole 31 and printed circuit board sound hole 46. Bezel sound hole 51 is disposed at a position to oppose to bush sound hole 31 and printed circuit board sound hole 46. Two bezel slits 52 are disposed to penetrate side surfaces of bezel 50 at positions opposing to each other. Two connector claws 12 of connector 10 are fitted to two bezel slits 52, respectively, to mount bezel 50 to the microphone module.

In the manner as described above, the automotive microphone according to the present exemplary embodiment is configured.

The dimension between the lower surface of printed circuit board 41 and the upper surface of panel 20 is designed to be equal to or smaller than the dimension of bush 30 in the vertical direction so that bush 30 can elastically deform between the lower surface of printed circuit board 41 and the lower-side inner surface of bezel 50.

Also, in a case of the structure with bezel 50, the dimension between printed circuit board 41 and bezel 50 is designed be equal to or smaller than the dimension of bush 30 in the vertical direction.

This design allows bush 30 to be in contact with the lower surface of printed circuit board 41 at first contact surface 32 in such a manner that first contact surface 32 surrounds the circumference of bush sound hole 31, and to be in contact with the lower-side inner surface of bezel 50 at second contact surface 33 in such a manner that second contact surface 33 surrounds the circumference of bush sound hole 31. Accordingly, bush 30 can prevent a sound wave having entered from bezel sound hole 51 from leaking through bush sound hole 31, and a sound wave having entered from the other area than bezel sound hole 51 from propagating around to enter bush sound hole 31.

An external pickup-target sound, such as a voice produced by a speaker, enters bezel sound hole 51, and the sound wave having entered bezel sound hole 51 is picked up by bottom port mount microphone sensor 43 through bush sound hole 31 and printed circuit board sound hole 46. The sound having reached bottom port mount microphone sensor 43 is converted by bottom port mount microphone sensor 43 to an electric signal. The electric signal is converted by the electric circuit on printed circuit board 41 to an output signal, which is output from connector pins 11.

If sealing is insufficient on printed circuit board—bush contact surface 81 between printed circuit board 41 and bush 30 or on bush—bezel contact surface between bush 30 and bezel 50, the sound wave of the pickup-target sound would propagate around from a path other than the above-described path for the pickup-target sound. Such sound wave reaching bottom port mount microphone sensor 43 after having been propagated around has a path difference from the sound wave reaching bottom port mount microphone sensor 43 through the normal path for the pickup-target sound, and thus causes a phase shift relative to the pickup-target sound. Accordingly, echo is generated.

Furthermore, in a case where a plurality of bottom port mount microphone sensors 43 is provided, signals produced by phase-shifted sound waves are mixed, so that degradation of the performance of the microphone module is caused in the signal processing stage. In some examples of microphone modules practically mounted to automobiles, noises enter from the upper part of connector 10, so that it is likely that the noises would enter through printed circuit board—bush contact surface 81 or bush—bezel contact surface 82. Therefore, the sealing structure for noise reduction as described above prevents degradation of the microphone module performances.

According to the present exemplary embodiment, sealing on printed circuit board—bush contact surface 81 or on bush—bezel contact surface 82 can be achieved by making bush 30 by an elastic material and designing the dimension of bush 30 in the vertical direction to be equal to or larger than the dimension between panel 20 and printed circuit board 41 or to be equal to or larger than the dimension between bezel 50 and printed circuit board 41.

Second Exemplary Embodiment

Figure 2A:
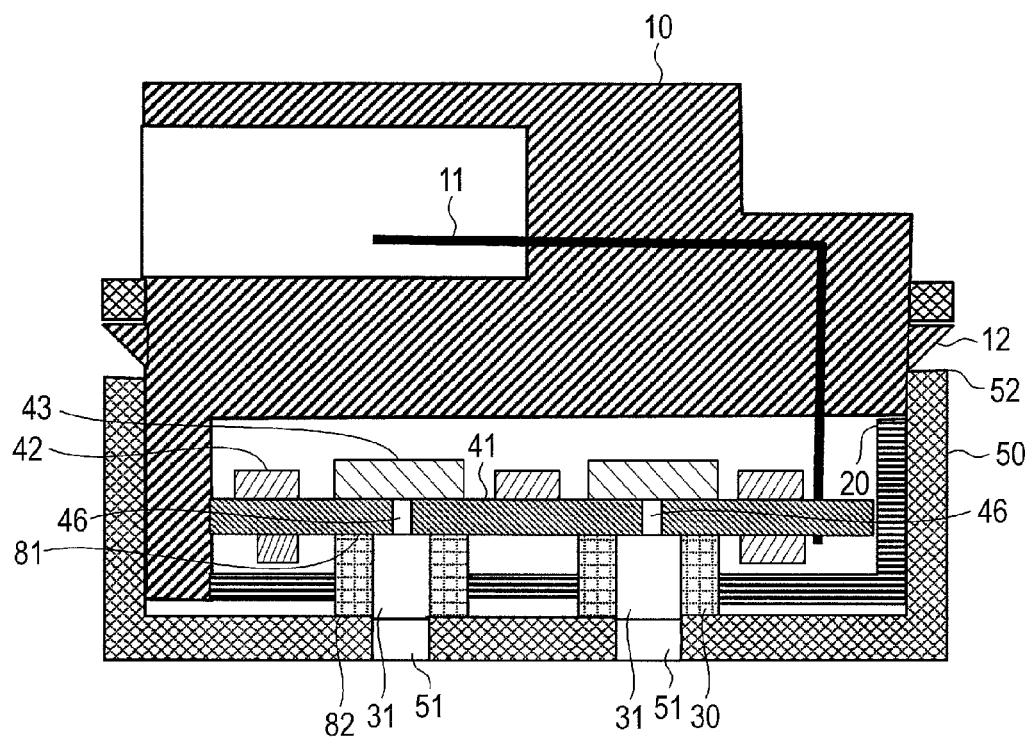
FIG. 2A is a diagram illustrating an inner structure of an automotive microphone according to a second exemplary embodiment.
Figure 2B:
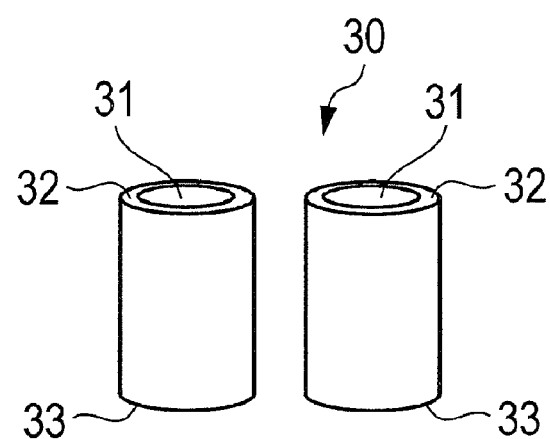
FIG. 2B is a perspective view illustrating a bush of the automotive microphone according to the second exemplary embodiment.

FIG. 2A is a diagram illustrating an inner structure of an automotive microphone according to a second exemplary embodiment. FIG. 2B is a perspective view illustrating a structure of bush 30 of the automotive microphone according to the second exemplary embodiment.

The automotive microphone according to the second exemplary embodiment differs from the automotive microphone according to the first exemplary embodiment in the configurations of bezel sound hole 51 and bush sound hole 31. Hereinafter, explanation on the configurations which are common to the first exemplary embodiment will be omitted (much the same will be true on the other exemplary embodiments).

In the automotive microphone according to the present exemplary embodiment, plural printed circuit board sound holes 46, plural bush sound holes 31 and plural bezel sound holes 51 are provided to respectively correspond to plural bottom port mount microphone sensors 43. In other words, an individual path for allowing the pickup-target sound to propagate is formed for each of plural bottom port mount microphone sensors 43 by the correspondingly provided set of bezel sound hole 51, bush sound hole 31 and printed circuit board sound hole 46.

Like this, in the present exemplary embodiment, a pair of bezel sound hole 51 and bush sound hole 31 is provided to communicate with a corresponding one of plural printed circuit board sound holes 46 which correspond respectively to plural bottom port mount microphone sensors 43. Therefore, sound waves entering respective one of plural printed circuit board sound holes 46 are limited to sound waves coming from a corresponding bush sound hole 31 communicated with the respective one of printed circuit board sound holes 46. Accordingly, it is possible to reduce the phase shifts of sound waves reaching respective bottom port mount microphone sensors 43. In addition, uniformity in frequency components contained in the sound waves is improved, so that the signal processing performances can be further improved.

According to the present exemplary embodiment, it is possible to achieve improvement of the performances of the microphone module by proving respective sets of printed circuit board sound hole 46, bush sound hole 31 and bezel sound hole 51 for plural bottom port mount microphone sensors 43 depending on the number of bottom port mount microphone sensors 43.

It is preferable that the shapes of bush sound holes 31 are the same. This allows the signal processing performances to be improved, so that the performances of the microphone module can be improved. Similarly, it is also preferable that the shapes of printed circuit board sound holes 46 are the same, and that the shapes of bezel sound holes 51 are the same. This allows the signal processing performances to be improved, so that the performances of the microphone module can be improved.

Third Exemplary Embodiment

Figure 3A:
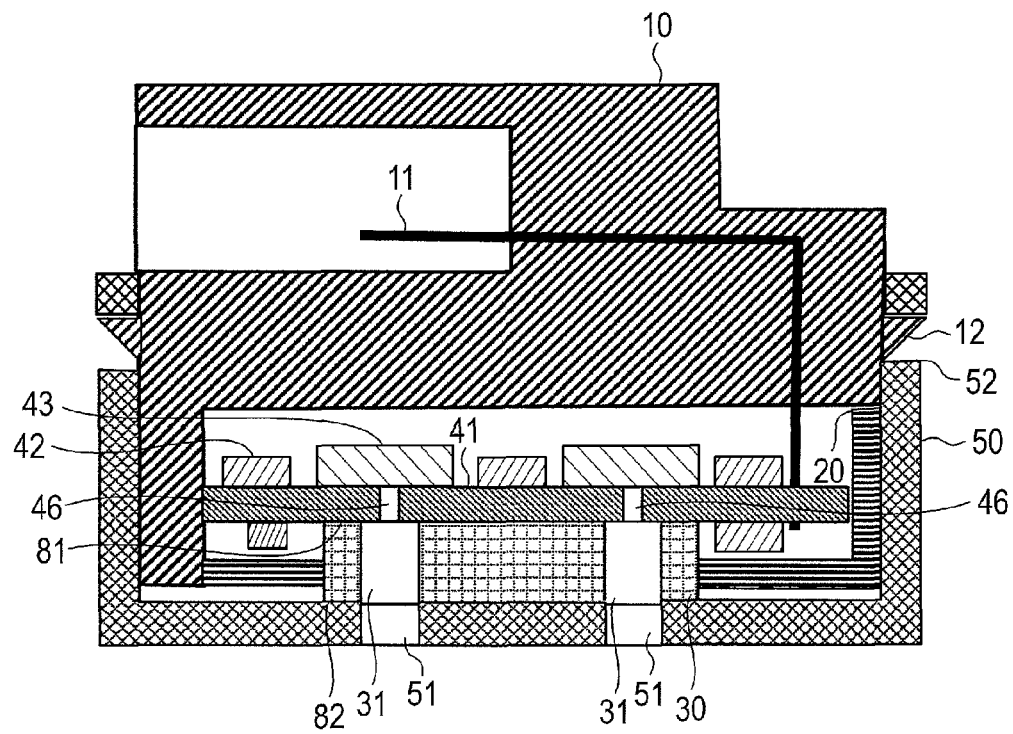
FIG. 3A is a diagram illustrating an inner structure of an automotive microphone according to a third exemplary embodiment.
Figure 3B:
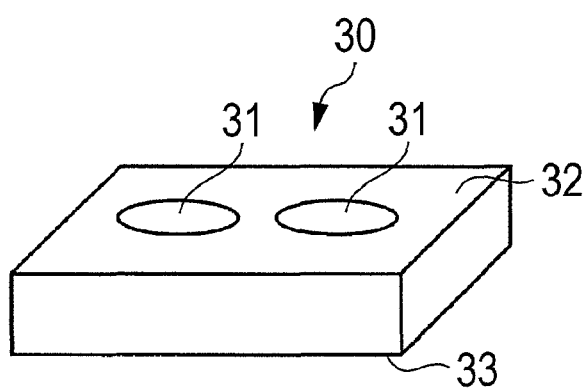
FIG. 3B is a perspective view illustrating a bush of the automotive microphone according to the third exemplary embodiment.

FIG. 3A is a diagram illustrating an inner structure of an automotive microphone according to a third exemplary embodiment. FIG. 3B is a perspective view illustrating a structure of bush 30 of the automotive microphone according to the third exemplary embodiment.

In the automotive microphone according to the present exemplary embodiment, like the automotive microphone according to the second exemplary embodiment, plural sets of printed circuit board sound hole 46, bush sound hole 31 and bezel sound hole 51 are provided so as to respectively correspond to plural bottom port mount microphone sensors 43.

On the other hand, unlike the second exemplary embodiment, bush 30 of the automotive microphone according to the present exemplary embodiment is made by a single bush member integrally formed to be provided with plural bush sound holes 31.

If plural bushes 30 are separately provided to respectively correspond to plural bottom port mount microphone sensors 43, the number of times of assembling will increase, so that increase in the assembling man-hours or the like will be caused. Therefore, by providing plural bush sound holes 31 on a single bush member, it is possible to achieve the same performances as those of the second exemplary embodiment as well as to achieve a structure that can be easily assembled, so that cheap microphone modules can be provided.

Like the second exemplary embodiment, it is also preferable that printed circuit board sound holes 46, bush sound holes 31 and bezel sound holes 51 according to the present exemplary embodiment have their respective same shapes. This allows the signal processing performances to be improved, so that the performances of the microphone module can be improved.

Fourth Exemplary Embodiment

Figure 4A:
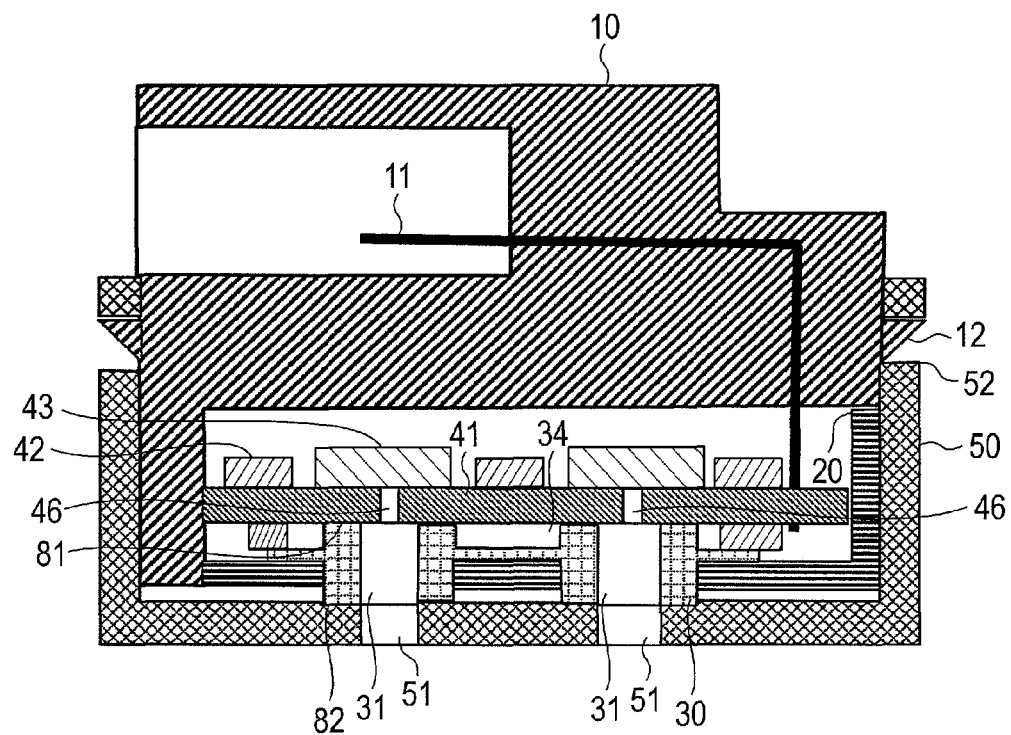
FIG. 4A is a diagram illustrating an inner structure of an automotive microphone according to a fourth exemplary embodiment.
Figure 4B:
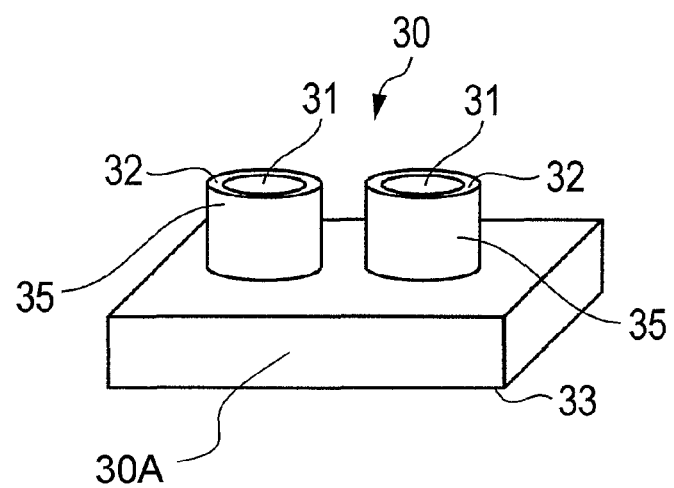
FIG. 4B is a perspective view illustrating a bush of the automotive microphone according to the fourth exemplary embodiment.

FIG. 4A is a diagram illustrating an inner structure of an automotive microphone according to a fourth exemplary embodiment. FIG. 4B is a perspective view illustrating a structure of bush 30 of the automotive microphone according to the fourth exemplary embodiment.

In the automotive microphone according to the present exemplary embodiment, like the automotive microphone according to the third exemplary embodiment, plural sets of printed circuit board sound hole 46, bush sound hole 31 and bezel sound hole 51 are provided so as to respectively correspond to plural bottom port mount microphone sensors 43. Also, like the third exemplary embodiment, bush 30 is integrally formed so that a single bush member has plural bush sound holes 31.

On the other hand, in the automotive microphone according to the present exemplary embodiment, unlike the third exemplary embodiment, bush 30 has plural protrusions 35 which are protruding upward at positions of plural bush sound holes 31, respectively. Plural protrusions 35 surround the respective outer circumferences of plural bush sound holes 31. In other words, bush 30 of the present embodiment body 30A and plural protrusions 35 which are protruding upward from the upper surface of body 30A. Each of bush sound holes 31 penetrates body 30A and one of protrusions 35. First contact surfaces 32 of bush 30 are in contact with the lower surface of printed circuit board 41 at respective protrusions 35.

In this structure, bush groove 34 may be formed in an area on the upper surface of body 30A at which protrusions 35 are not formed as shown in FIG. 4A. By providing bush groove 34 on bush 30, a space is formed between the lower surface of printed circuit board 41 and bush groove 34. Accordingly, mount components can be mounted on the lower surface of printed circuit board 41 in the area corresponding to bush groove 34. As a result, it is possible to reduce the mounting area of the entire microphone module, so that cheap and smaller-size microphone modules can be provided.

Although concrete examples of the present disclosure have been described hereinabove, they are merely examples, and are not intended to limit the scope of the claims. The techniques recited in the claims may include various changes and modifications of the above-described concrete examples.

The present disclosure relates to automotive microphones and is applicable to microphone modules that are required to be high in performances and small in size for use, for example, in automobiles.

What is claimed is:

1. A microphone comprising: a printed circuit board having a first surface and a second surface in a rare side of the printed circuit board from the first surface, and provided with a first sound hole through the first surface and the second surface; a microphone element mounted on the first surface of the printed circuit board so as to cover the first sound hole; a microphone casing provided with a second sound hole, and housing the printed circuit board such that the second sound hole opposes to the first sound hole; and a bush provided with a third sound hole disposed between the second sound hole and the first sound hole so as to be communicated with the first sound hole and the second sound hole, and having: a first contact surface in contact with the second surface of the printed circuit board at a first end of the third sound hole; and a second contact surface in contact with an inner surface of the microphone casing at a second end of the third sound hole, wherein the microphone element is disposed so as to pick up an external sound wave through the second sound hole, the third sound hole and the first sound hole, the microphone element is one of a plurality of the microphone elements mounted on the printed circuit board, the first sound hole is one of a plurality of first sound holes provided to the printed circuit board, the second sound hole is one of a plurality of second sound holes provided to the microphone casing, the third sound hole is one of a plurality of third sound holes provided to the bush, the plurality of the first sound holes, the plurality of the second sound holes, and the plurality of the third sound holes are provided so as to correspond to the plurality of the microphone elements, respectively, the bush has a body and a plurality of protrusions which are protruding from the body, each of the plurality of the third sound holes penetrates the body and one of the plurality of the protrusions, and the first contact surface is each of surfaces of the protrusions in contact with the second surface of the printed circuit board.

2. The microphone according to claim 1,
wherein the microphone casing includes:
a panel surrounding the printed circuit board;
a bezel mounted on an outer surface of the panel; and
a connector electrically connected to the microphone element so as to take an electric signal produced by the microphone element out of the microphone.

3. The microphone according to claim 1,
wherein the bush has a cylindrical shape.

4. The microphone according to claim 1,
the bush is one of a plurality of bushes each provided with the plurality of third sound holes, and the plurality of the first sound holes, the plurality of the second sound holes, and the plurality of the bushes are provided so as to correspond to the plurality of the microphone elements, respectively.

\* \* \* \* \*